US011302625B2

United States Patent
Xu et al.

(10) Patent No.: US 11,302,625 B2
(45) Date of Patent: Apr. 12, 2022

(54) RADIO FREQUENCY TRANSISTOR FOR IMPROVING RADIO FREQUENCY SWITCH PERFORMANCE, CHIP AND MOBILE TERMINAL

(71) Applicant: VANCHIP (TIANJIN) TECHNOLOGY CO., LTD., Tianjin (CN)

(72) Inventors: Guanjian Xu, Tianjin (CN); Yunfang Bai, Tianjin (CN)

(73) Assignee: VANCHIP (TIANJIN) TECHNOLOGY CO., LTD., Tianjin (CN)

(*) Notice: Subject to any disclaimer, the term of this patent is extended or adjusted under 35 U.S.C. 154(b) by 0 days.

(21) Appl. No.: 16/621,663

(22) PCT Filed: Jul. 1, 2018

(86) PCT No.: PCT/CN2018/093938
§ 371 (c)(1),
(2) Date: Dec. 11, 2019

(87) PCT Pub. No.: WO2018/228602
PCT Pub. Date: Dec. 20, 2018

(65) Prior Publication Data
US 2020/0194366 A1   Jun. 18, 2020

(30) Foreign Application Priority Data
Jun. 12, 2017   (CN) .......................... 201710440225.2

(51) Int. Cl.
*H01L 23/66*   (2006.01)
*H01L 23/522*   (2006.01)
(Continued)

(52) U.S. Cl.
CPC .......... *H01L 23/5222* (2013.01); *H01L 23/66* (2013.01); *H01L 29/0649* (2013.01); *H01L 29/7838* (2013.01)

(58) Field of Classification Search
CPC ............ H01L 23/5222; H01L 29/0649; H01L 29/7838
See application file for complete search history.

(56) References Cited

U.S. PATENT DOCUMENTS

| 6,630,715 B2* | 10/2003 | Parker | ................. H01L 29/0692 257/357 |
| 2012/0086497 A1* | 4/2012 | Vorhaus | ................. H03F 3/604 327/427 |

(Continued)

FOREIGN PATENT DOCUMENTS

| CN | 101661937 A | 3/2010 |
| CN | 105742363 A | 7/2016 |

(Continued)

OTHER PUBLICATIONS

International Search Report in the international application No. PCT/CN2018/093938 dated Oct. 11, 2018.
Written Opinion of the International Search Authority in the international application No. PCT/CN2018/093938, dated Oct. 11, 2018 with English translation provided by Google Translate.
Examination Report from GB app. No. GB2001828.9, dated Aug. 23, 2021, all pages.

*Primary Examiner* — Benjamin P Sandvik
(74) *Attorney, Agent, or Firm* — Ladas & Parry, LLP

(57) ABSTRACT

Disclosed are a radio frequency transistor for improving radio frequency switch performance, a chip and a mobile terminal. The radio frequency transistor comprises a first metal layer, a second metal layer, a polysilicon layer and an active area, the first metal layer being connected to the active area via contact holes, the first metal layer being connected to the second metal layer via through holes. The wiring direction of the second metal layer is perpendicular to the wiring direction of the polysilicon layer, thereby reducing parallel areas between the polysilicon layer and the first (Continued)

metal layer and decreasing the numbers of contact holes and through holes, so as to reduce the off capacitance. In addition, space saved by the first metal layer wiring and the contact holes is utilized, thereby increasing the channel width of the radio frequency transistor accommodated in a same chip area, and reducing the on-resistance.

9 Claims, 3 Drawing Sheets

(51) Int. Cl.
*H01L 29/06* (2006.01)
*H01L 29/78* (2006.01)

(56) References Cited

U.S. PATENT DOCUMENTS

2014/0103434 A1\* 4/2014 Lu ................... H01L 29/41758
    257/346
2017/0201702 A1\* 7/2017 Niwa ................ H01L 27/14612

FOREIGN PATENT DOCUMENTS

| CN | 106656128 A | 5/2017 |
| CN | 107275311 A | 10/2017 |
| KR | 20170016828 A1 | 2/2017 |

\* cited by examiner

RADIO FREQUENCY TRANSISTOR FOR IMPROVING RADIO FREQUENCY SWITCH PERFORMANCE, CHIP AND MOBILE TERMINAL

CROSS-REFERENCE TO RELATED APPLICATIONS

This application is a national phase application of International Patent Application No. PCT/CN2018/093938, filed on Jul. 1, 2018, which claims priority to Chinese Application No. 201710440225.2, filed on Jun. 12, 2017, the contents of which are hereby incorporated by reference in their entireties.

BACKGROUND

Technical Field

The present invention relates to a radio frequency transistor, in particular to a radio frequency transistor for improving radio frequency switch performance, also relates to a radio frequency switch chip and a mobile terminal including the radio frequency transistor, and belongs to the technical field of radio frequency integrated circuits.

Related Art

Existing mobile terminal equipment, such as smart phones and tablet computers are all integrated with multiple wireless communication services using different frequency bands (GSM/EDGE, TD-SCDMA/WCDMA, FDD/TD-LTE). The mobile terminal equipment not only needs to work in a multi-mode and multi-frequency cellular band, but also provides Wi-Fi, WiMAX, GPS, Bluetooth, RFID and other non-cellular communication services. Use of a multi-mode and multi-band power amplifier can be realized by a radio frequency switch, thereby lowering the design complexity, and reducing the cost and the power consumption. Furthermore, Wi-Fi modules, Bluetooth modules and other modules also need to switch between transmitting signals and receiving signals via the radio frequency switch. Moreover, a multi-antenna design becomes increasingly popular to improve sensitivity and avoid crosstalk. For these reasons, the radio frequency switch plays a more and more important role in the radio frequency front end design of wireless mobile terminal equipment.

As one of the main performance indexes of the radio frequency switch, a bandwidth determines the maximum operating frequency and the minimum operating frequency of the radio frequency switch, and is usually expressed by a quality factor. The lower the quality factor is, the greater the bandwidth and the higher the radio frequency switch performance are. Since the off capacitance and the on-resistance of the radio frequency switch directly influence the quality factor, the quality factor of the radio frequency switch can be decreased only by reducing the off capacitance and the on-resistance of the radio frequency switch. Therefore, how to reduce the off capacitance and the on-resistance of the radio frequency switch to improve the radio frequency switch performance is an urgent problem needing to be solved.

SUMMARY

The first technical problem to be solved by the present invention is to provide a radio frequency transistor for improving radio frequency switch performance.

The other technical problem to be solved by the present invention is to provide a radio frequency switch chip and a mobile terminal including the radio frequency transistor.

In order to fulfill the aims of the present invention, the following technical scheme is adopted:

According to a first aspect of embodiments of the present invention, a radio frequency transistor for improving the radio frequency switch performance is provided, including a first metal layer, a second metal layer, a polysilicon layer and an active area, the first metal layer is connected to the active area via contact holes, and the first metal layer is connected to the second metal layer via through holes;

a wiring direction of the second metal layer is perpendicular to a wiring direction of the polysilicon layer, thereby reducing parallel areas between the first metal layer and the polysilicon layer and decreasing numbers of the contact holes and the through holes.

Preferably, the polysilicon layer and the second metal layer adopt a comb wiring way, and the first metal layer adopts a strip wiring way.

Preferably, the active area includes a source area and a drain area. A straight grid or curved grid polysilicon layer is arranged above the active area. The polysilicon layer extends out of the active area.

When the polysilicon layer adopts a curved grid structure, the parallel areas between the first metal layer and the polysilicon layer are reduced, and the numbers of the contact holes and the through holes are decreased, and at the same time, a channel width of the radio frequency transistor accommodated in a same chip area is increased, thereby reducing an off capacitance and an on-resistance.

Preferably, the first metal layer is evenly arranged above the polysilicon layer. The first metal layer is connected to the source area and the drain area of the active area after passing through an empty area of the polysilicon layer.

Preferably, the second metal layer is arranged symmetrically above the first metal layer. The second metal layer adopts an interdigital wiring way. Overlapping areas of the second metal layer and the first metal layer are connected via the through holes.

Preferably, a quality factor of a radio frequency switch is: Fom=Coff×Ron. Fom is the quality factor. Coff is the off capacitance. Ron is the on-resistance.

Preferably, the off capacitance is: Coff=Cfet+(C1+C2+C3+C4)/2, where Cfet is an intrinsic capacitance of the radio frequency transistor, C1 is a parallel capacitance between the contact holes and the polysilicon layer, C2 is a parallel capacitance between the first metal layer and the polysilicon layer, C3 is a parallel capacitance between the through holes and the polysilicon layer, and C4 is a parallel capacitance between the second metal layer and the polysilicon layer.

According to a second aspect of the embodiments of the present invention, a radio frequency switch chip including the radio frequency transistor is provided.

According to a third aspect of the embodiments of the present invention, a mobile terminal including the radio frequency transistor is provided.

In the radio frequency transistor provided by the present invention, the wiring direction of the second metal layer is perpendicular to the wiring direction of the polysilicon layer, thereby reducing the parallel areas between the polysilicon layer and the first metal layer and decreasing the numbers of the contact holes and the through holes, so as to reduce a capacitance brought by the radio frequency transistor metal wiring, and reduce the off capacitance. In addition, space saved by the first metal layer wiring and the contact holes is fully utilized, thereby increasing the channel width of the radio frequency transistor accommodated in a same chip area, and reducing the on-resistance. The quality factor of the radio frequency switch can be decreased and the bandwidth can be increased by reducing the capacitance brought by the radio frequency transistor metal wiring and the on-resistance, thereby improving radio frequency switch performance.

DETAILED DESCRIPTION

Figure 1:
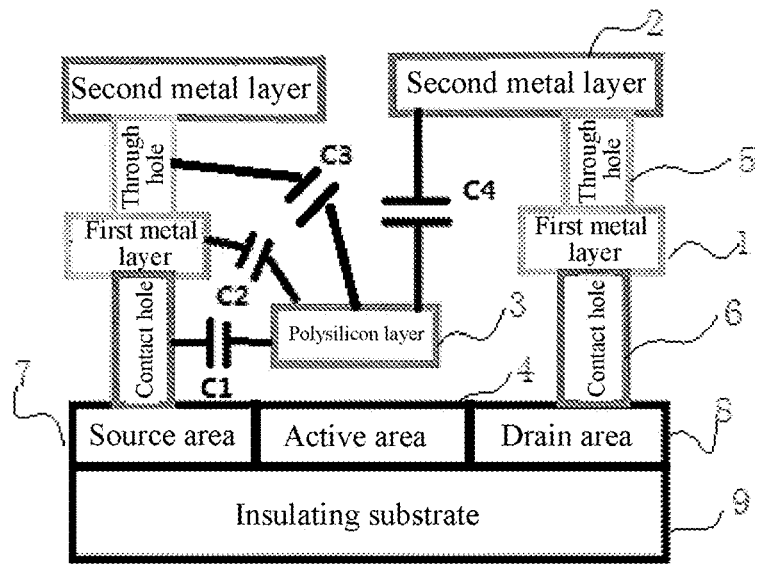
FIG. 1 is a schematic structure diagram of a capacitance model of a radio frequency transistor.

The following further describes the technical content of the present disclosure with reference to the accompanying drawings and specific embodiments.

Since the maximum operating frequency and the minimum operating frequency of a radio frequency switch are determined by a bandwidth, the maximum operating frequency and the minimum operating frequency of the radio frequency switch are usually expressed by a quality factor. The lower the quality factor is, the greater the bandwidth is. The quality factor Fom can be expressed as:

$$Fom = Coff \times Ron \quad (1)$$

Coff is an off capacitance and Ron is an on-resistance. According to the formula (1), the off capacitance Coff and the on-resistance Ron directly influence the performance of the radio frequency switch and a whole communication system.

In the prior art, it is generally considered that the off capacitance Coff is mainly determined by process parameters, while the influence of a wiring way of the radio frequency transistor (mainly referring to a radio frequency MOSFET transistor, hereinafter referred to as radio frequency MOS transistor) of the radio frequency switch on the off capacitance Coff is ignored. In fact, as proved by many simulations and experiments, the numerical values of the off capacitance Coff under different wiring ways of the radio frequency MOS transistor differ remarkably. The higher the frequency is, the more remarkable the difference is. The off capacitance Coff can be expressed as:

$$Coff = Cfet + Cline \quad (2)$$

Cfet is an intrinsic capacitance of the radio frequency MOS transistor and Cline is a capacitance brought by the radio frequency MOS transistor metal wiring. Since the intrinsic capacitance Cfet of the radio frequency MOS transistor is basically totally concentrated in an active area of the radio frequency MOS transistor, the intrinsic capacitance Cfet of the radio frequency MOS transistor is mainly determined by the process parameters of the radio frequency MOS transistor and a channel length of the radio frequency MOS transistor. Under the same process, the process parameters of the radio frequency MOS transistor are given, and are difficult to modify. Then, in the radio frequency switch, in order to reduce the off capacitance Coff and the on-resistance Ron and save the area of the radio frequency switch, the minimum channel length of the radio frequency MOS transistor is usually selected when the process allows. Therefore, under given process conditions, it is very difficult to change the off capacitance Coff by changing the intrinsic capacitance Cfet of the radio frequency MOS transistor.

A line capacitance (Cline) brought by the radio frequency MOS transistor metal wiring can be expressed as:

$$Cline = Cgd \times Cgs/(Cgd + Cgs) + Cds \quad (3)$$

Cgd is a capacitance between a grid and a drain of the radio frequency MOS transistor, Cgs is a capacitance between the grid and a source of the radio frequency MOS transistor, Cds is a capacitance between the drain and the source of the radio frequency MOS transistor. Since the radio frequency MOS transistor is a symmetrical device, under the consideration of the symmetry of the radio frequency switch, the metal wiring of the source and the metal wiring of the drain of the radio frequency MOS transistor are as symmetrical as possible. Since the source and the drain of the radio frequency MOS transistor are approximately symmetrical, it can be concluded that: the capacitance Cgd between the grid and the drain of the radio frequency MOS transistor and the capacitance Cgs between the grid and the source of the radio frequency MOS transistor are equal, so that the formula (3) can be transformed into:

$$Cline = Cgs/2 + Cds \quad (4)$$

For the convenience of calculation, a calculation model is constructed by relatively common two-layer metal wiring by the radio frequency transistor provided by the present invention. As shown in FIG. 1, the radio frequency MOS transistor includes a first metal layer 1, a second metal layer 2, a polysilicon layer 3 and an active area 4. The active area 4 is arranged on an insulating substrate 9. The active area 4 includes a source area 7 and a drain area 8. The source area 7 and the drain area 8 are connected to the first metal layer 1 via corresponding contact holes 6. The first metal layer 1 is connected to the second metal layer 2 via corresponding through holes 5. The capacitance Cgd between a grid and a drain of the radio frequency MOS transistor or the capacitance Cgs between the grid and a source of the radio frequency MOS transistor is a sum of the capacitance between the first metal layer 1, the second metal layer 2, the through holes 5, the contact holes 6 and the polysilicon layer 3 respectively. The capacitance between the contact holes 6 and the polysilicon layer 3 is expressed as C1, the capacitance between the first metal layer 1 and the polysilicon layer 3 is expressed as C2, the capacitance between the through holes 5 and the polysilicon layer 3 is expressed as C3, and the capacitance between the second metal layer 2 and the polysilicon layer 3 is expressed as C4. Since the metal wiring of the source and the metal wiring of the drain of the radio frequency MOS transistor are as symmetrical as possible, the capacitance C1 between the contact holes 6 and the polysilicon layer 3, the capacitance C2 between the first metal layer 1 and the polysilicon layer 3, and the capacitance C3 between the through holes 5 and the polysilicon layer 3 are symmetrical on the source and the drain of the radio frequency MOS transistor. Since the capacitance between the drain and the source of the radio frequency MOS transistor is much smaller than the capacitance Cgd between the grid and the drain of the radio frequency MOS transistor or the capacitance Cgs between the grid and the source of the radio frequency MOS transistor, the following formula can be derived:

$$Cline=(C1+C2+C3+C4)/2 \quad (5)$$

By substituting the formula (5) into the formula (2), the following formula can be derived:

$$Coff=Cfet+(C1+C2+C3+C4)/2 \quad (6)$$

Since the intrinsic capacitance Cfet of the radio frequency MOS transistor is a process-related parameter, the intrinsic capacitance Cfet of the radio frequency MOS transistor can be considered as a constant under the situation that the process conditions are consistent and the parameters of the radio frequency MOS transistor are the same (mainly referring to the channel length and width of the radio frequency MOS transistor). Then, the off capacitance Coff can be reduced by reducing the capacitance C1 between the contact holes 6 and the polysilicon layer 3, the capacitance C2 between the first metal layer 1 and the polysilicon layer 3, the capacitance C3 between the through holes 5 and the polysilicon layer 3, and the capacitance C4 between the second metal layer 2 and the polysilicon layer 3.

Figure 2:
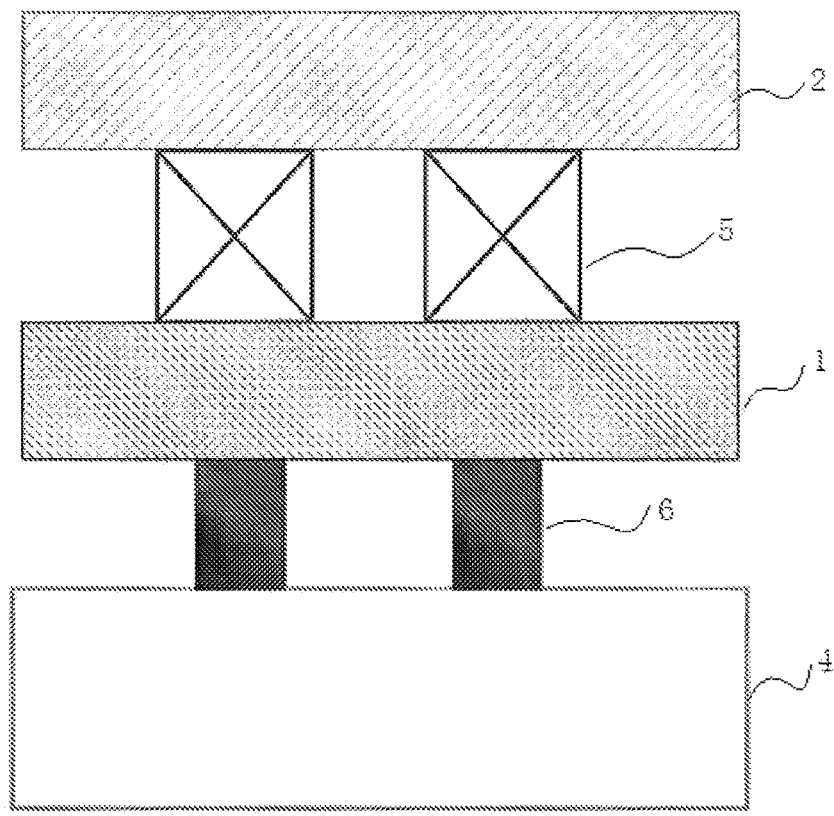
FIG. 2 is a schematic diagram of a connection relationship among a first metal layer, a second metal layer and an active area in the wiring way of a radio frequency transistor.

As shown in FIG. 2, a blank box area refers to the active area 4, a diagonal box area inclining leftwards refers to the first metal layer 1, and a diagonal box area inclining rightwards refers to the second metal layer 2. The active area 4 is connected to the first metal layer 1 via the contact holes 6, and the first metal layer 1 is connected to the second metal layer 2 via the through holes 5.

Figure 3:
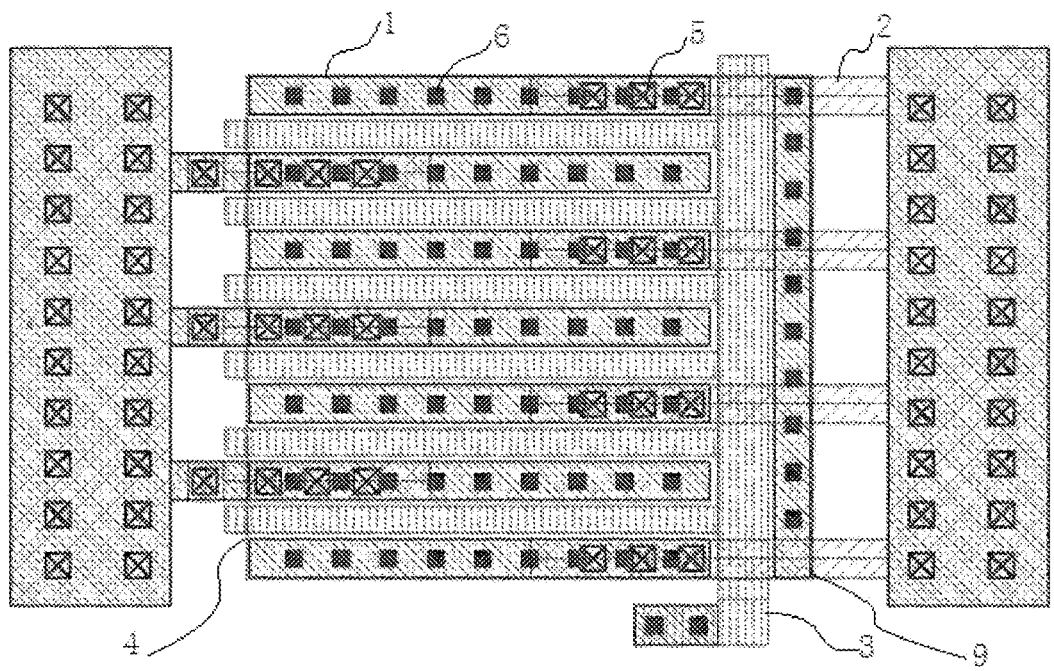
FIG. 3 is a schematic diagram of the wiring way of a radio frequency transistor in the prior art.

In an existing general radio frequency switch, the common wiring way of the radio frequency MOS transistor is shown in FIG. 3, where the radio frequency MOS transistor adopts an interdigital wiring way. A polysilicon layer 3 adopting a comb wiring way is arranged above the active area 4 (a source area and a drain area). The polysilicon layer 3 is connected to the first metal layer 1 adopting a strip wiring way via the contact holes 6, thereby forming a grid end (grid) of the radio frequency MOS transistor. The first metal layer 1 adopting the comb wiring way is arranged above the polysilicon layer 3. The first metal layer 1 is connected to the active area 4 via the contact holes 6 respectively, i.e., the first metal layer 1 is connected to the source area and the drain area of the radio frequency MOS transistor via the contact holes 6 respectively. The first metal layer 1 being connected to the source area and the drain area respectively is interdigital and symmetrical. The upper side of the first metal layer 1 is covered with the second metal layer 2 adopting the comb wiring way. The first metal layer 1 is connected to the second metal layer 2 via the through holes 5. A source end and a drain end (a source and a drain) of the radio frequency MOS transistor are formed via the second metal layer 2. It should be emphasized that the source and the drain of the radio frequency MOS transistor are interchangeable since the source and the drain are symmetrical. In the radio frequency MOS transistor, the first metal layer 1 adopting the strip wiring way is connected to the insulating substrate 9 of the radio frequency MOS transistor via the contact holes 6, thereby forming a substrate end.

The capacitance C1 between the contact holes 6 and the polysilicon layer 3 is a parallel capacitance between the contact holes 6 and the polysilicon layer 3, the capacitance C2 between the first metal layer 1 and the polysilicon layer 3 is a parallel capacitance between the first metal layer 1 and the polysilicon layer 3, the capacitance C3 between the through holes 5 and the polysilicon layer 3 is a parallel capacitance between the through holes 5 and the polysilicon layer 3, and the capacitance C4 between the second metal layer 2 and the polysilicon layer 3 is a parallel capacitance between the second metal layer 2 and the polysilicon layer 3; then, under the given channel width of the radio frequency MOS transistor, the capacitance value of the capacitance C1 between the contact holes 6 and the polysilicon layer 3 is determined by the number of the contact holes 6 and the distances between the contact holes 6 and the polysilicon layer 3, the capacitance value of the capacitance C2 between the first metal layer 1 and the polysilicon layer 3 is determined by the distance between the first metal layer 1 wiring and the polysilicon layer 3 wiring, the capacitance value of the capacitance C3 between the through holes 5 and the polysilicon layer 3 is determined by the number of the through holes 5 and the distances between the through holes 5 and the polysilicon layer 3, and the capacitance value of the capacitance C4 between the second metal layer 2 and the polysilicon layer 3 is determined by the distance between the second metal layer 2 wiring and the polysilicon layer 3 wiring.

In the wiring ways of the radio frequency MOS transistor, a wiring direction of the polysilicon layer 3 of the radio frequency MOS transistor is parallel to wiring directions of the first metal layer 1 and the second metal layer 2, the numbers of the contact holes 6 and the through holes 5 are increased, and a parallel area between the polysilicon layer 3 and the first metal layer 1 is relatively large, thereby increasing the line capacitance (Cline) introduced by the radio frequency MOS transistor metal wiring, so as to increase the off capacitance Coff.

In order to reduce the line capacitance (Cline) introduced by the radio frequency MOS transistor metal wiring, the radio frequency transistor provided by the present invention adopts two wiring ways. The two wiring ways are described in detail through specific embodiments as follows.

Embodiment 1

Figure 4:
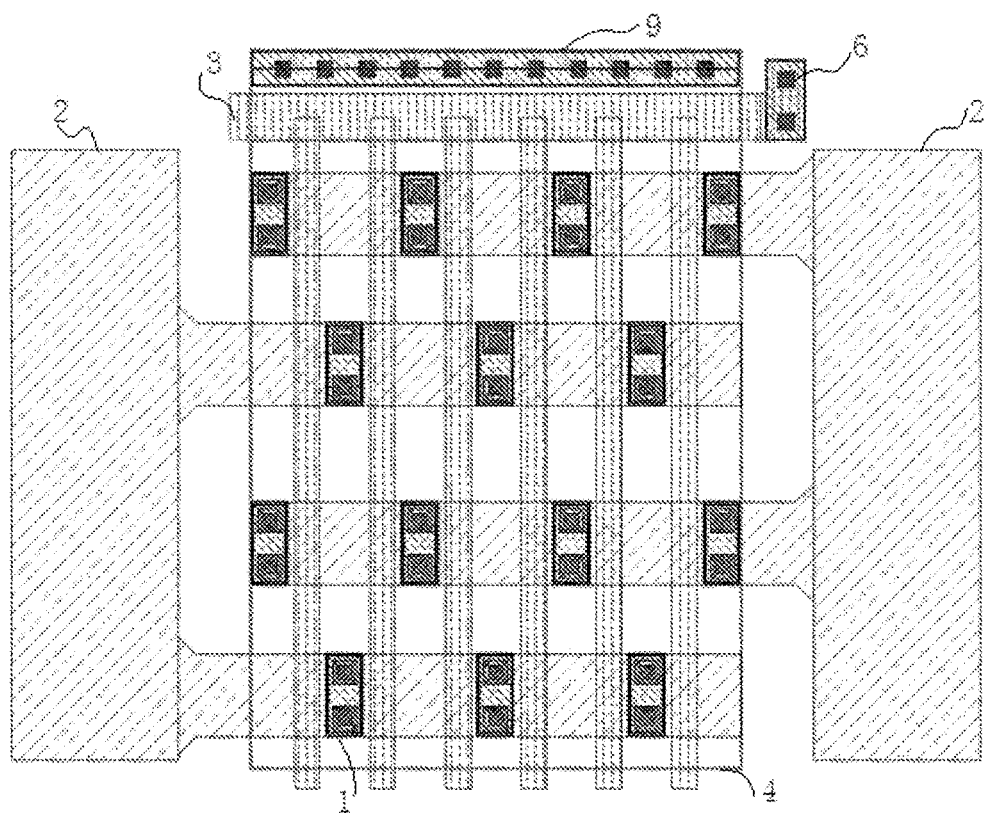
FIG. 4 is a schematic diagram of the wiring way of a radio frequency transistor provided by Embodiment 1 of the present invention.

As shown in FIG. 4, a radio frequency transistor provided by the present embodiment adopts a first wiring way. The wiring way refers to an interdigital structure. A straight grid polysilicon layer 3 adopting a comb wiring way is arranged above an active area 4 (a source area and a drain area). The polysilicon layer 3 extends out of the active area 4. The polysilicon layer 3 is connected to a first metal layer 1 adopting a strip wiring way via contact holes 6, thereby forming a grid end (grid) of a radio frequency MOS transistor. The first metal layer 1 being connected to an insulating substrate 9 of the radio frequency MOS transistor is arranged close to the polysilicon layer 3. The first metal layer 1 is connected to the insulating substrate 9 via the contact holes 6, thereby forming a substrate end. The first metal layer 1 adopting the strip wiring way is evenly arranged above the polysilicon layer 3. The first metal layer 1 passes through an empty area adopting the comb wiring of the polysilicon layer 3, but the first metal layer 1 is not overlapped with the empty area. The first metal layer 1 is connected to the active area 4 via the contact holes 6, i.e., the first metal layer 1 is connected to the source area and the drain area of the radio frequency MOS transistor via the contact holes 6 respectively. Since the source and the drain of the radio frequency MOS transistor are symmetrical, the source and the drain are interchangeable, so that the positions of the source area and the drain area are interchangeable. A second metal layer 2 adopting the comb wiring way is arranged symmetrically above the first metal layer 1. The second metal layer 2 wiring is interdigital, and is perpendicular to the wiring direction of the polysilicon layer 3. Overlapping areas of the first metal layer 1 being connected to the active area 4 and the second metal layer 2 are connected via through holes 5, and a source end and a drain end (a source and a drain) of the radio frequency MOS transistor are formed via the second metal layer 2.

When the radio frequency transistor provided by the present embodiment adopts the above wiring way, the wiring direction of the second metal layer 2 is perpendicular to the wiring direction of the polysilicon layer 3, thereby reducing parallel areas between the polysilicon layer 3 and the first metal layer 1, and decreasing the numbers of the contact holes 6 and the through holes 5, so as to reduce the line capacitance (Cline) brought by the radio frequency MOS transistor metal wiring and reduce the off capacitance Coff. As proved by simulation experiments, by adopting the first wiring way for the radio frequency MOS transistor provided by the present embodiment, the off capacitance Coff can be reduced by 30%-100%, while the on-resistance Ron can be increased by 0%-20%. According to the formula (1), the quality factor Fom is entirely decreased, and the bandwidth is increased, thereby improving the radio frequency switch performance.

Embodiment 2

Figure 5:
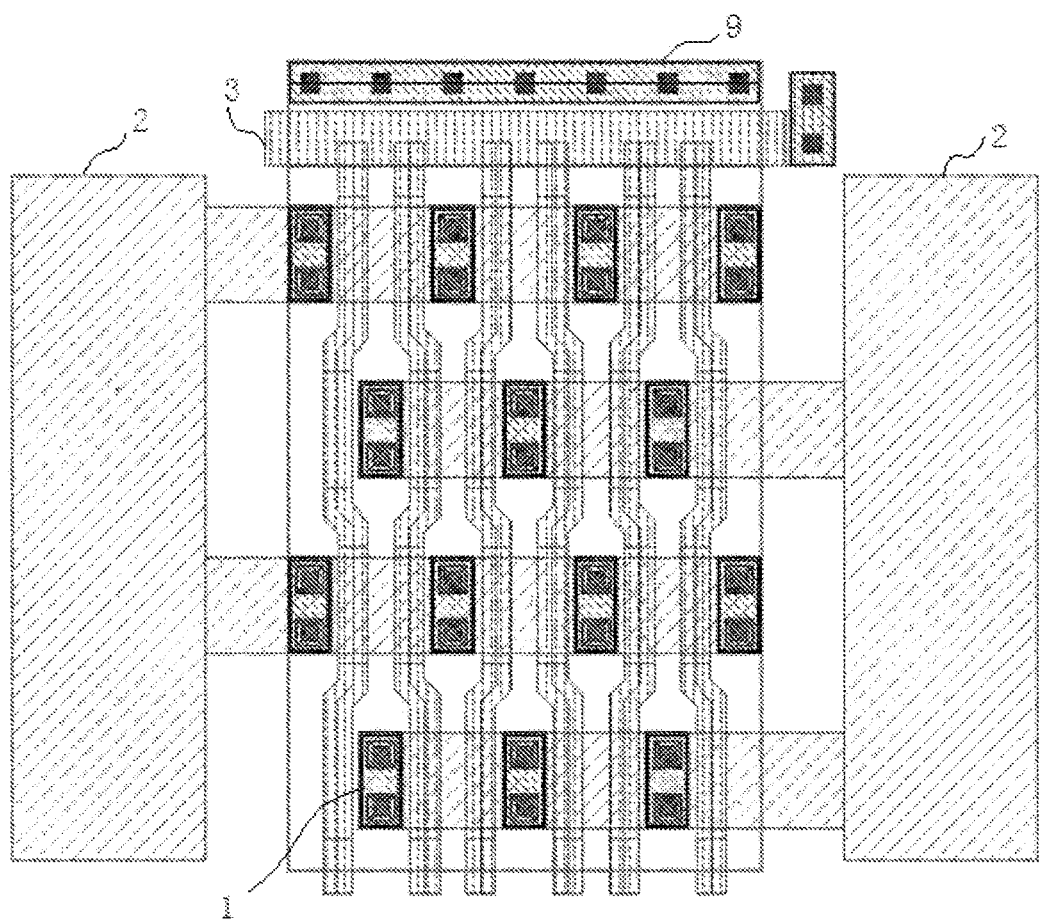
FIG. 5 is a schematic diagram of the wiring way of a radio frequency transistor provided by Embodiment 2 of the present invention.

As shown in FIG. 5, a radio frequency transistor provided by the present embodiment adopts a second wiring way. The wiring way differs from the first wiring way in the Embodiment 1 in that: the wiring way of the polysilicon layer 3 is a curved grid structure. Similarly, the first metal layer 1 passes through an empty area of the polysilicon layer 3 adopting the curved grid wiring. The first metal layer 1 is not overlapped with the empty area. The first metal layer 1 is connected to the active area 4 via contact holes 6, i.e., the first metal layer 1 is connected to a source area and a drain area of a radio frequency MOS transistor via the contact holes 6 respectively. In the present embodiment, the specific wiring of other parts is the same as that in the Embodiment 1, and will not be described herein. In the second wiring way, the wiring direction of the second metal layer 2 is perpendicular to the wiring direction of the polysilicon layer 3, thereby reducing parallel areas between the polysilicon layer 3 and the first metal layer 1, and decreasing the numbers of the contact holes 6 and the through holes 5, so as to reduce the line capacitance (Cline) brought by the radio frequency MOS transistor metal wiring and reduce the off capacitance Coff. By adopting the second wiring way, space saved by the first metal layer 1 wiring and the contact holes 6 is fully utilized, thereby increasing the channel width of the radio frequency MOS transistor accommodated in a same chip area, and reducing the on-resistance Ron. According to the formula (1), the quality factor Fom is further decreased, and the bandwidth is further increased, thereby improving the radio frequency switch performance.

In the radio frequency transistor for improving the radio frequency switch performance provided by the present invention, the wiring direction of the second metal layer is perpendicular to the wiring direction of the polysilicon layer, thereby reducing the parallel areas between the polysilicon layer and the first metal layer and decreasing the numbers of the contact holes and the through holes, so as to reduce the capacitance brought by the radio frequency transistor metal wiring and reduce the off capacitance. In addition, the space saved by the first metal layer wiring and the contact holes is fully utilized, thereby increasing the channel width of the radio frequency transistor accommodated in a same chip area, and reducing the on-resistance. By reducing the capacitance brought by the radio frequency transistor metal wiring and the on-resistance, the quality factor of the radio frequency switch is decreased and the bandwidth is increased, thereby improving the radio frequency switch performance.

The radio frequency transistor provided by the present invention can be applied to a radio frequency switch chip to improve the radio frequency switch performance. The specific structure of the radio frequency transistor in the radio frequency switch chip is not described in detail herein.

In addition, the radio frequency transistor can also be applied to a mobile terminal as an important component of a radio frequency integrated circuit. The mobile terminal refers to computer equipment which can be used in mobile environments and supports multiple communication systems such as GSM, EDGE, TD-SCDMA, TDD_LTE and FDD_LTE, including mobile phones, notebook computers, tablet computers and on-board computers. Moreover, the technical scheme provided by the present invention is also applicable to the application occasions of other radio frequency integrated circuits, such as communication base stations.

The radio frequency transistor for improving the radio frequency switch performance, the chip and the mobile terminal provided in the present invention have been described in detail above. Any obvious modification made by those of ordinary skill in the art to the present invention without departing from the essential of the present invention shall all fall within the protection scope of the present invention.

What is claimed is:

1. A radio frequency transistor for improving radio frequency switch performance, comprising a first metal layer, a second metal layer, a polysilicon layer and an active area, the first metal layer is evenly arranged above the polysilicon layer, and the first metal layer is connected to a source area and a drain area of the active area via contact holes after passing through an empty area of the polysilicon layer, and overlapping areas of the second metal layer and the first metal layer are connected via through holes;
   the polysilicon layer and the second metal layer adopt a comb wiring way, and
   a wiring direction of the second metal layer being perpendicular to a wiring direction of the polysilicon layer, thereby reducing parallel areas between the first metal layer and the polysilicon layer and decreasing numbers of the contact holes and the through holes.

2. The radio frequency transistor according to claim 1, wherein
   the first metal layer adopts a strip wiring way.

3. The radio frequency transistor according to claim 1, wherein
   a straight grid or curved grid polysilicon layer is arranged above the active area, and the polysilicon layer extends out of the active area.

4. The radio frequency transistor according to claim 3, wherein
   when the polysilicon layer adopts a curved grid structure, the parallel areas between the first metal layer and the polysilicon layer are reduced, the numbers of the contact holes and the through holes are decreased, and a channel width of the radio frequency transistor accommodated in a same chip area is increased, so as to reduce an off capacitance and an on-resistance.

5. The radio frequency transistor according to claim 1, wherein the second metal layer is arranged symmetrically above the first metal layer, the second metal layer adopts an interdigital wiring way.

6. The radio frequency transistor according to claim 1, wherein the quality factor of a radio frequency switch is Fom=Coff×Ron, wherein Fom is the quality factor, Coff is the off capacitance, and Ron is the on-resistance.

7. The radio frequency transistor according to claim 6, wherein the off capacitance is Coff=Cfet+(C1+C2+C3+C4)/2, wherein Cfet is an intrinsic capacitance of the radio frequency transistor, C1 is a parallel capacitance between the contact holes and the polysilicon layer, C2 is a parallel capacitance between the first metal layer and the polysilicon layer, C3 is a parallel capacitance between the through holes and the polysilicon layer, and C4 is a parallel capacitance between the second metal layer and the polysilicon layer.

8. A radio frequency switch chip, comprising the radio frequency transistor according to claim 1.

9. A mobile terminal, comprising the radio frequency transistor according to claim 1.

* * * * *